United States Patent [19]

Meszko

[11] Patent Number: 5,020,141
[45] Date of Patent: May 28, 1991

[54] ADAPTIVE IDENTIFYING SIGNAL DETECTOR

[75] Inventor: William R. Meszko, Fort Worth, Tex.

[73] Assignee: Motorola, Inc., Schaumburg, Ill.

[21] Appl. No.: 432,334

[22] Filed: Nov. 3, 1989

Related U.S. Application Data

[63] Continuation of Ser. No. 103,785, Oct. 2, 1987, abandoned.

[51] Int. Cl.$^5$ ............... H04B 1/10; H04B 1/16
[52] U.S. Cl. ................... 455/166; 455/194; 455/213; 455/221
[58] Field of Search ............ 455/161, 168, 194, 200, 455/212, 218, 219, 222, 165, 166, 35–38, 58, 213, 221

[56] References Cited

U.S. PATENT DOCUMENTS

| | | | |
|---|---|---|---|
| 4,356,568 | 10/1982 | Ogita et al. | 455/212 |
| 4,414,689 | 11/1983 | Enderson | 455/221 |
| 4,429,279 | 1/1984 | Wycoff et al. | 328/139 |
| 4,479,250 | 10/1984 | Flood | 455/221 |
| 4,517,561 | 5/1985 | Burke et al. | 455/35 |
| 4,525,867 | 6/1985 | Shiratani | 455/166 |
| 4,554,677 | 11/1985 | Smith | 455/58 |
| 4,718,116 | 1/1988 | Jacobs et al. | 455/35 |

Primary Examiner—Curtis Kuntz
Attorney, Agent, or Firm—Steven G. Parmelee

[57] ABSTRACT

A radio receiver capable of receiving more than one channel, one of which channels may be a priority channel, wherein some communications may be accompanied by a sub-audible continuous identifying signal, which signal can be detected by the radio in an adaptive way. In particular, a wideband, rapid detect approach can be utilized in the absence of a determination that adjacent identifying signals are present. To the extent such adjacent signals are present, the radio selects a narrowband, slower detection approach, or, in the alternative, shifts the bandpass characteristics of the wideband approach in an attempt to avoid the adjacent interfering signal.

6 Claims, 4 Drawing Sheets

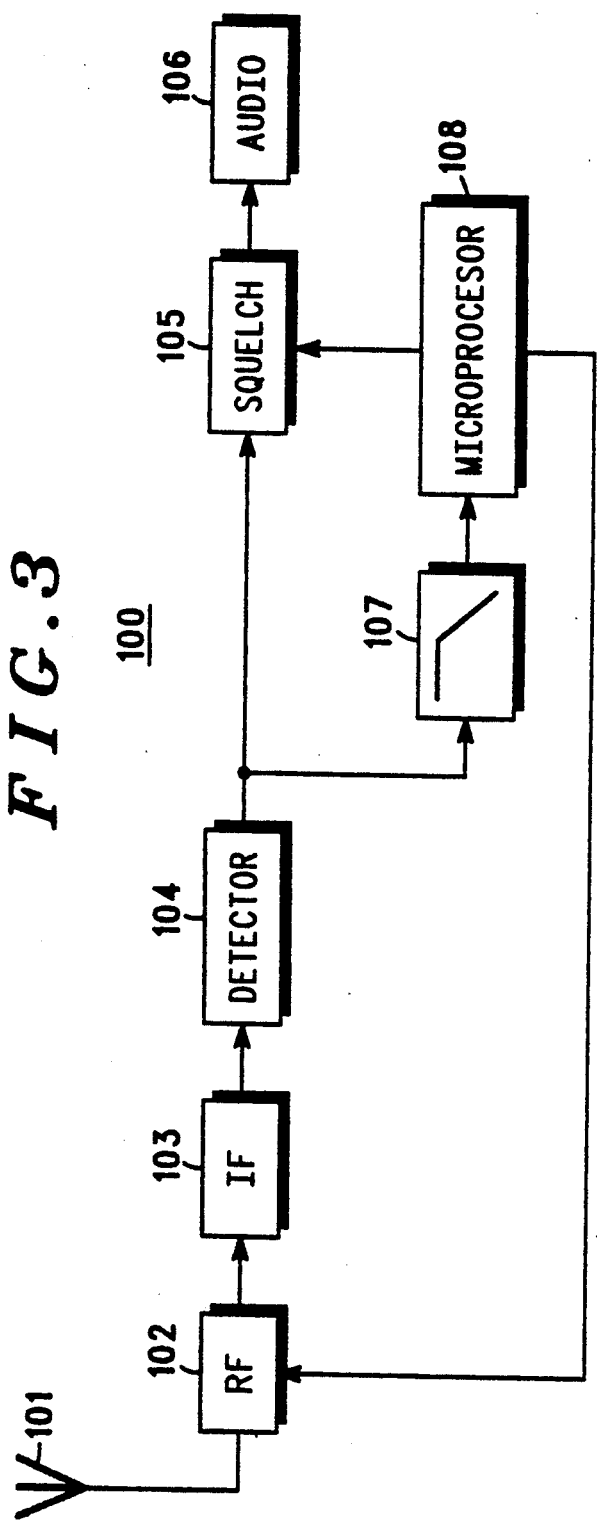

ADAPTIVE IDENTIFYING SIGNAL DETECTOR

This is a continuation of application Ser. No. 07/103,785, filed Oct. 2, 1987 and now abandoned.

TECHNICAL FIELD

This invention relates generally to radio frequency communications, and particularly to communications systems that use an identifying signal, such as a continuous tone, to control audio squelching.

BACKGROUND ART

In a modern radio communications system, a single radio transceiver may have the capability of accessing a large number of radio communications channels. In general, one or two of these channels will be designated "priority" channels for the individual using the radio. Important communications intended for this individual, such as emergency calls, will ordinarily occur on this channel.

Since the calls that occur on such a priority channel are, by definition, important, the individual has an obvious interest in hearing them. By the same token, that individual will also wish to be able to communicate on other channels as well. An obvious conflict develops; how to allow the individual the flexibility of monitoring or communicating on a non-priority channel while simultaneously remaining cognizant of pertinent communications on his priority channel(s).

One solution is to provide the individual with more than one radio; i.e., a separate radio for each priority channel, and another for non-priority communications. This solution presents serious cost and convenience obstacles.

Another solution has been to provide channel scanning features. From time to time, the radio will automatically switch to receiving the priority channel and monitor for activity. If activity is detected, the radio unsquelches and allows the operator to hear the priority channel activity. In the absence of activity, the radio returns to the communication in progress. Since channel activity can be detected in only a few milliseconds, such scanning activity can occur relatively transparently with respect to use of other channels by the operator.

The above solution will not adequately support all communications needs, however. In many systems, a number of different groups may use the same channel resources. As a result, communications occurring on a priority channel may not in fact be intended for all radio operators. If a radio in such an operating environment interrupts an ongoing non-priority communication and unsquelches on such a communication occurring on a priority channel, the operator's ability to make satisfactory use of the radio becomes highly impaired.

One solution to the above situation has been to include an identifying signal, such as a continuous tone, with the information signal. Through appropriate filtering, the presence or absence of a particular identifying signal can be detected by the radio. When a particular signal is so identified, the radio will then unsquelch and allow the operator to participate in the communication. Through use of such identifying signals, an operator will be spared the annoyance and disruption of having the radio unsquelch on irrelevant communications.

The above approach gives rise to new problems, however. In particular, since the identifying signals are generally precise frequencies in order to allow provision of a suitable number of signals to support the desired function, the detection filters must be narrowband (typically 3 Hertz or so). As a result, detection of the signal can consume an objectionable period of time, such as 150 to 250 milliseconds. When channel scanning, such a "hole" in an ongoing communication on another channel can be quite noticeable and annoying. To deal with this to some extent, some prior art radios simply remain on the priority channel when activity has been detected, but do not unsquelch in the absence of the correct particular identifying signal. Such an approach simply concedes the functional inoperability of this approach with respect to interrupting an ongoing communication, and makes the best of a bad situation by at least not providing the operator with an irrelevant communication.

A need clearly exists for a channel scanning and identifying tone detection device and method that provides minimal disruption to an ongoing communication while simultaneously assuring that pertinent priority communications are detected and unsquelched in a rapid manner.

SUMMARY OF THE INVENTION

These needs and others are substantially met through provision of a radio receiver that has a first detector for detecting the identifying signal within a first period of time, a second detector for detecting the identifying signal within a second period of time that exceeds the first period of time, and a control unit for controlling when the first and second detectors are used to detect the identifying signal at a particular point in time. In one embodiment, the first detector can include a relatively wide band filter that will pass both the identifying signal of interest and possibly other, adjacent identifying signals that may be present. The second detector can also include a filter, though this filter would be of a narrower bandpass, and would essentially allow passage of only a particular identifying signal of interest.

In use, the radio would ordinarily use the first detector (i.e., the wideband filter) to detect presence of the identifying signal when channel scanning. Being a wideband filter, detection will occur more rapidly than with a narrow band approach. Upon detecting the identifying signal, the squelch control can then be appropriately manipulated to allow the operator to hear the priority communication.

If, however, the second detector, which is activated following detection of the identifying signal by the first detector, determines that the identifying signal of interest is not present (therefore indicating that an adjacent identifying signal is present), the communication can again be squelched, and appropriate action taken. In one embodiment, the appropriate action would be to simply maintain the second detector as the detector of choice for some period of time. In another embodiment, the center frequency of the first detector's bandpass can be moved to attempt to still identify a particular identifying signal of interest while avoiding any adjacent identifying signals that are causing false detections.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 3 comprises a block diagram depiction of radio receiver incorporating the invention.

BEST MODE FOR CARRYING OUT THE INVENTION

Figure 1A:
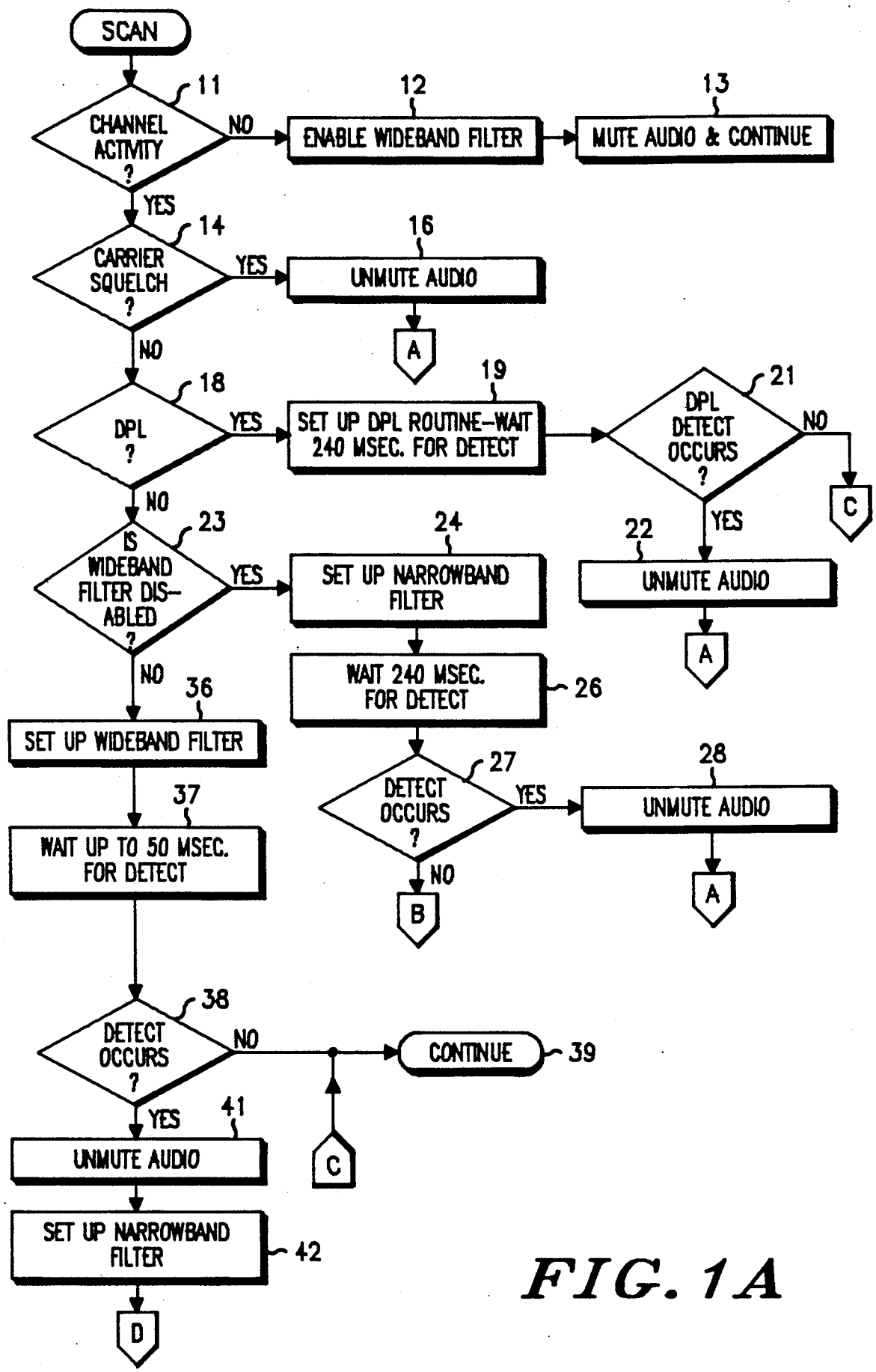
FIG. 1(a) and 1(b) comprise a flow chart depiction of the channel scanning routine.

This invention relates to an improvement in a radio receiver that will support both channel scanning and conventional radio operation on a multiplicity of channels. Such a radio might be, for example, the Syntor X 9000 800 MHz mobile radio as manufactured by Motorola, Inc. The Syntor X 9000 utilizes a microprocessor that can be appropriately controlled to support the channel scanning and adaptive bandwidth identifying signal detection features described herein.

Such a radio can be seen as depicted generally in FIG. 3 by the numeral 100. Such a radio includes an antenna (101) for receiving RF signals and an RF UNIT (102) for appropriately preprocessing such signals. The particular frequencies received by the RF unit (102) are controlled at least in part by the microprocessor (108). The RF processed signals are reduced to an appropriate IF frequency by an IF unit (103) and the modulated signals are detected (104). The detected signals are then processed through a squelch unit (105) and rendered audible when appropriate (106). The detected signals are also appropriately filtered (107) to pass only an identifying signal if present to the microprocessor (108). The microprocessor controls the squelch gate (105) at least in part as a function of whether the identifying signal appears to be present or not.

Figure 1B:
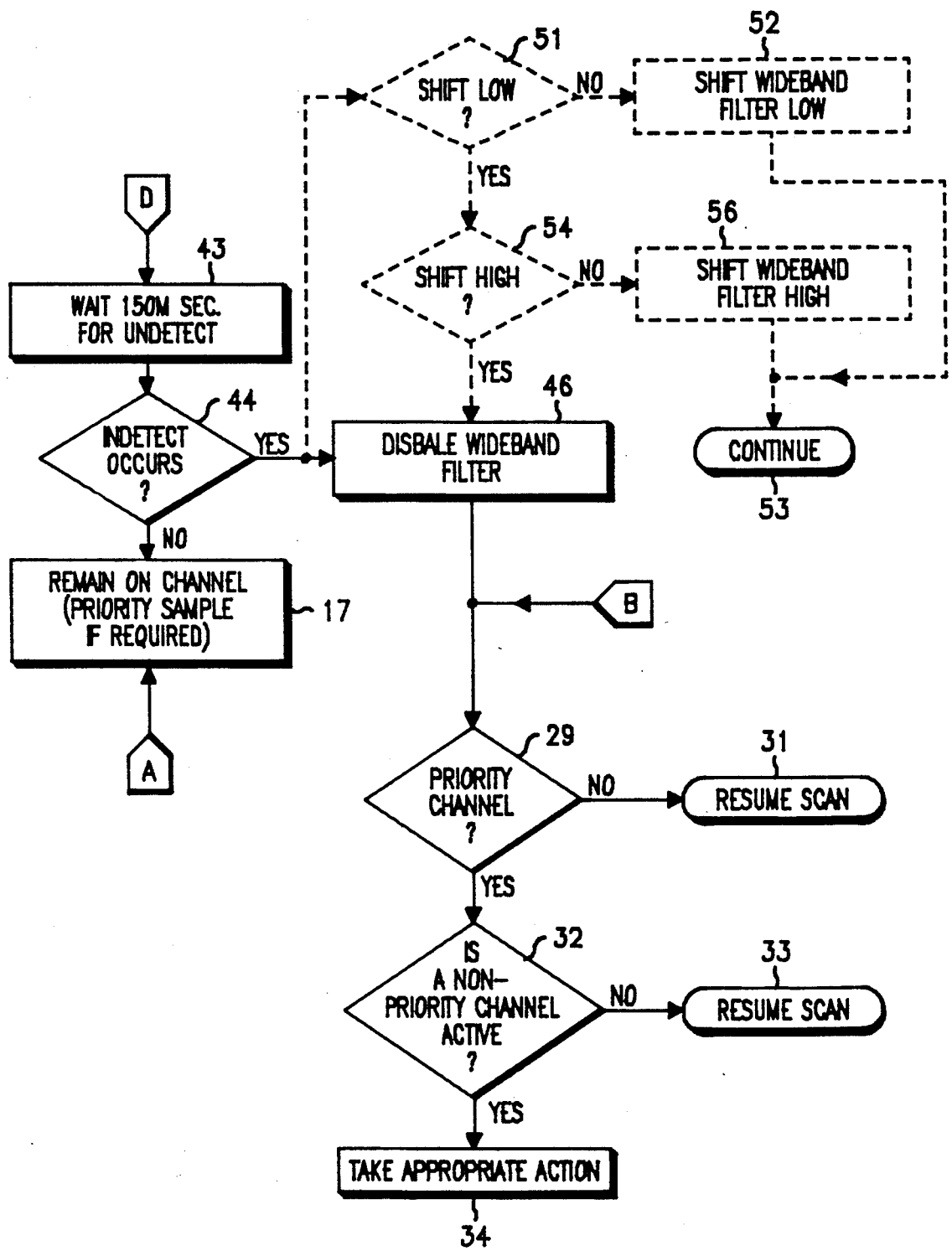

With reference to FIGS. 1(a) and 1(b), a description of the channel scan feature of the invention will now be set forth.

The routine begins by selecting a particular communications channel and monitoring it for channel activity (11). In the absence of channel activity, the routine enables the wideband filter (12) (as described below in more detail), mutes audio (13) in the event that the audio has not already been muted, and continues.

If channel activity has been detected (11), the routine determines whether a carrier squelch option for this particular communications channel has been selected (14). If it has, the radio unmutes (16). The radio then remains on channel to allow participation in and/or monitoring of the communication, and also supports additional channel scanning activities as may be appropriate with respect to other priority channels (A)(17).

If carrier squelch has not been selected (14), the routine determines whether Private Line (PL) (a trademark of Motorola, Inc.) has been selected (18). If so, the routine allows establishment of the DPL detect, which requires approximately 240 milliseconds for detection (19). If a PL detect occurs (21), the routine unmutes the audio (22) and allows the radio to remain on channel (17). If PL detect does not occur (21), the routine continues (22) in a manner appropriate to the PL function and purpose.

If the PL controlled squelch option has not been selected (18), the routine determines whether the wideband filter has been disabled (23). If so, the routine allows establishment of a narrowband filter (24) and allows an appropriate period of time (240 milliseconds) for detection of an appropriate identifying signal (i.e., a particular sub-audible continuous tone) (26). If the identifying tone can be detected (27), the audio unmutes (28) and the radio remains on channel (A)(17).

If detection does not occur (27), the routine determines whether the communications channel being monitored constitutes a priority channel (B)(29). If not, the routine resumes scanning (31). If the channel does constitute a priority channel, however, the routine determines whether a non-priority channel was active prior to initiating the scan routine (32) (i.e., was the radio previously engaged in participating in and/or monitoring a non-priority communication when the scanning routine was initiated). If not, the scan routine resumes (33). If an ongoing communication was interrupted, the routine then takes appropriate action as determined by the system designer (34). For example, the radio may remain on channel without unmuting the audio. Another appropriate action that may be appropriate in a given system would be to introduce a longer interval between times when the radio initiates the scan routine and thereby interrupts the non-priority communication. Yet another possibility would be the prior art approach of remaining on the priority channel and unmuting the audio so that the operator can hear the communication even though it may not be relevant to him.

If the wideband filter has not been disabled (23), the routine establishes the wideband filter (36) in a manner to be described below in more detail. The routine then attempts to detect the identifying signal of interest, which, with a wideband filter, requires approximately 50 milliseconds (37). If a detect does not occur (38), the routine simply continues (39). If a detect does occur, the routine will unmute audio (41) and allow the operator to hear the ongoing communication on the priority channel.

Following this, the radio will then establish the narrowband filter as a confirming step (42) and allow the narrowband filter detection approach to detect the presence of the particular identifying signal in question (43). If the identifying signal of interest can be detected (44), the radio remains on channel as described above (17). If the identifying signal of interest cannot be detected (44), however, the radio will disable the wideband filter (46) and proceed as described above to determine whether the communications channel in question constitutes a priority channel (B)(29).

In the alternative, upon determining in the confirming step that the identifying signal of interest is absent (44), the routine can shift the center frequency of the bandpass characteristics of the wideband filter in an attempt to avoid the apparently adjacent identifying signal. For example, the routine can determine whether the center frequency has already been shifted low (51). If it has not, the wideband filter can be shifted low (52) and the routine can continue. If this shift allows the radio to continue using the faster wideband filter approach, without detecting the interfering identifying signal, then the routine will continue to operate as indicated in a rapid and acceptable manner. If the routine determines that it has already shifted the wideband filter low (51), the routine determines whether it has already shifted the wideband filter high (54). If it has not, the wideband filter can be shifted high (56) and the routine will continue (53). If the routine has already shifted the wideband filter high (54), then the wideband filter can be disabled (46) and the routine continues as described above.

So configured, a radio programmed as described above will ordinarily attempt to make use of a rapid first detector that will determine the presence or absence of an identifying signal of interest. If the presence of adjacent identifying signals interferes with this operation, the routine can, in one embodiment, adapt itself to attempt to continue using a rapid first detector by changing the bandpass characteristics of the filter associated therewith. If this fails, the radio can then adapt itself to a narrowband, albeit slower, approach.

Figure 2:
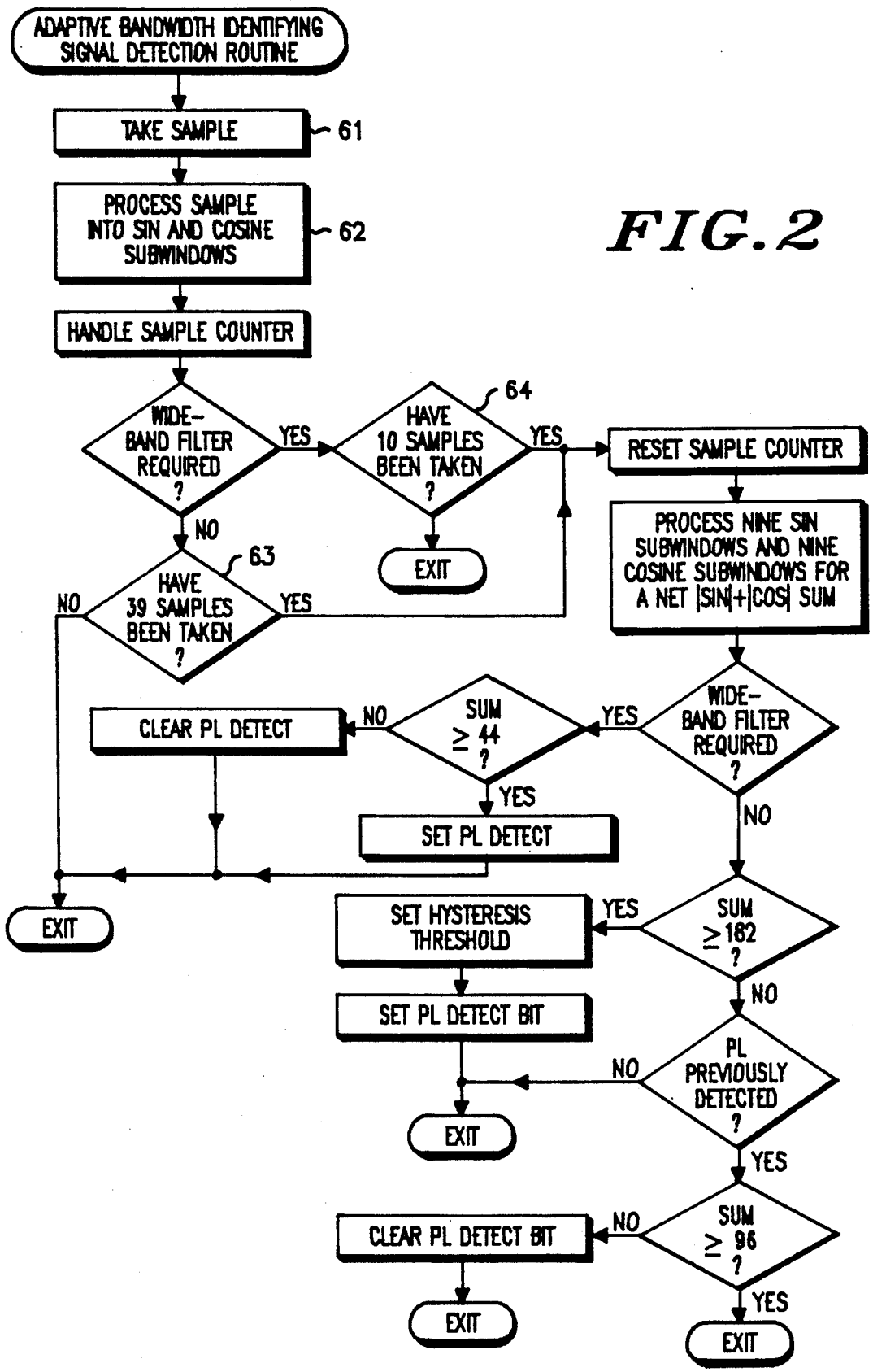
FIG. 2 comprises a flow chart depiction of the adaptive bandwidth identifying signal detection routine.

Referring now to FIG. 2, the adaptive bandpass identifying signal detection routine can be described. At the outset, it should be noted that this detection routine constitutes a digitally implemented continuous tone detection technique, which basic technique is described in U.S. Pat. No. 4,302,817, the latter being incorporated herein by this reference. It will suffice for present purposes to note that this technique provides for the taking of samples (61), which samples can be processed into appropriate sub-windows (62), an analysis of which can support detection of the identifying signals of interest. The ordinary approach (i.e., the narrowband filter approach) provides for the taking of 39 samples (63).

Pursuant to this invention, a fewer number of samples (such as only 10 samples) can be selected to thereby provide wideband filter performance (64). Based upon this information, an appropriate signal indicating detection or lack of detection can be provided as described in the incorporated reference for use as indicated by the scan routine.

The above approach could also be implemented, of course, through use of discrete element filters, the operability of which is controlled in the same manner as that described above with respect to the scan routine.

Those skilled in the art will recognize that the above described invention could be modified without departing from the spirit and scope of the invention. It should therefore be specifically understood that the claims of the invention are not to be considered as being limited to the precise embodiment set forth in the absence of express limitations directed thereto.

I claim:

1. In a radio receiver having:
   receiver means for receiving, on any of a plurality of channels, radio frequency signals including an information signal, wherein some of said radio frequency signals also include squelch control signal;
   channel selection means for selecting which of said plurality of channels will be received;
   first detector means for detecting presence of a particular one of said squelch control signals within a first period of time;
   squelch means for selectively rendering said information signal audible and inaudible; and channel scanning means for causing:
   said channel selector means to select a particular channel;
   said channel selection means to retain said particular channel when said
   first detector means detects said particular one of said squelch control signals; and
   said squelch means to render said information signal audible, an improvement comprising:
   second detector means for detecting presence of said particular one of said squelch control signals within a second period of time, wherein said second period of time is less than said first period of time; and
   control means for controlling which of said detector means is used to detect said particular one of said squelch control signals, such that said channel scanning means will cause said channel selection means to retain said particular channel and will cause said squelch means to render said information signal audible when either of said first and second detector means, as controlled by said control means, detects said particular one of said squelch control signals.

2. The improvement of claim 1 wherein said first detector means includes a first filter having a first bandpass and said second detector means includes a second filter having a second bandpass, wherein said first bandpass is wider than said second bandpass.

3. A method of scanning a radio communications channel that may include an information signal, wherein said information signal may be accompanied by a squelch control signal, the method comprising the steps of:
   A) monitoring said radio communications channel from time to time;
   B) estimating whether a particular one of said squelch control signals is present on said radio communications channel, such that said estimating is concluded within a first period of time;
   C) discontinuing monitoring of said radio communications channel when said estimating does not indicate presence of said particular one of said squelch control signals;
   D) continuing monitoring of said radio communications channel when said estimating does indicate presence of said particular one of said squelch control signals, and confirming that said particular one of said squelch control signals is present on said radio communications channel, wherein said confirming is concluded within a second period of time, which second period of time is longer than said first period of time;
   E) discontinuing monitoring of said radio communications channel when said confirming step fails to confirm presence of said particular one of said squelch control signals.

4. The method of claim 3 wherein said estimating step includes the step of passing said squelch control signal, if present, through a first filter having a first bandpass that will pass said squelch control signal therethrough.

5. The method of claim 4 wherein said confirming step includes the step of passing said squelch control signal, if present, through a second filter having a second bandpass that will pass said squelch control signal therethrough and that is narrower than said first bandpass.

6. The method of claim 5 and further including, in step e, the steps of shifting said first bandpass of said first filter.

* * * * *